United States Patent [19]

Yamane et al.

[11] Patent Number: 4,525,297

[45] Date of Patent: Jun. 25, 1985

[54] ELECTRO-CONDUCTIVE THERMOPLASTIC RESIN FOAM AND PREPARATION PROCESS THEREOF

[75] Inventors: Toshihiro Yamane, Otsu; Kenzi Ohashi, Hikone; Toshiharu Sakaguchi, Ageo, all of Japan

[73] Assignees: Toray Industries, Inc.; Tokyo Printing Ink Mfg. Co., Ltd., both of Tokyo, Japan

[21] Appl. No.: 557,162

[22] PCT Filed: Apr. 11, 1983

[86] PCT No.: PCT/JP83/00109
§ 371 Date: Nov. 28, 1983
§ 102(e) Date: Nov. 28, 1983

[87] PCT Pub. No.: WO83/03610
PCT Pub. Date: Oct. 27, 1983

[30] Foreign Application Priority Data

Apr. 14, 1982 [JP] Japan .................. 57-60908

[51] Int. Cl.$^3$ ............................. H01B 1/06
[52] U.S. Cl. .................... 252/511; 521/79; 521/82; 521/138; 521/140; 521/149; 204/159.11; 204/159.14; 204/159.2
[58] Field of Search ............... 252/511, 502; 524/495, 524/496; 521/79, 82, 140, 143, 144, 149, 138; 204/159.11, 159.14, 159.2, 159.17

[56] References Cited

U.S. PATENT DOCUMENTS 4,431,575  2/1984  Fujie et al. .................. 252/511

FOREIGN PATENT DOCUMENTS 52-103597  8/1977  Japan .
57-155240  9/1982  Japan .
141431  9/1982  Japan .

OTHER PUBLICATIONS

Polymer Chemistry—pp. 3, 5.
Polymer and General Chemistry—p. 4.

*Primary Examiner*—Josephine L. Barr
*Attorney, Agent, or Firm*—Cushman, Darby & Cushman

[57] ABSTRACT

An electro-conductive foam is prepared by mixing together 100 parts by weight of a resin component consisting of 10 to 90 parts by weight of a crystalline thermoplastic polyolefin type resin and 10 to 90 parts by weight of a low-crystalline thermoplastic resin with 5 to 40 parts by weight of electro-conductive carbon, by cross linking this mixture and then forming it by heating.

By using the mixture of crystalline polyolefin type thermoplastic resins and low-crystalline thermoplastic resins as the resinous component, the present invention provides an electro-conductive foam having a good foam surface condition and capabilities of deep-draw forming.

This electro-conductive foam is utilized as a material for semiconductor integrated circuit containers and similar applications.

8 Claims, No Drawings

ELECTRO-CONDUCTIVE THERMOPLASTIC RESIN FOAM AND PREPARATION PROCESS THEREOF

FIELD OF THE ART

The present invention relates to a polyolefin electro-conductive thermoplastic foam and a process for preparation thereof.

BACKGROUND OF THE ART

An electro-conductive thermoplastic foam is a promising material which can find wide applications in packing, transporting, and storing precision gauges such as electronic elements, or in making antistatic carpet underlays. Especially, concurrently with the striking development in electronic industries in recent years, there is increasing need for a shock absorbent material with excellent electro-conductivity for housing integrated circuits which require measures for preventing static electricity buildup. Film and resin-like materials which are conventional electro-conductive materials lack shock absorption capabilities, and sometimes have allowed integrated circuits (I.C.) or parts containing I.C. to break during transportation. In carbon black-impregnated polyurethane foam which has long been marketed as a foam, there are also faults such as carbon black being separated from the foam, which impairs the electro-conductivity, contaminates the product, and aggravates the working conditions; moreover, shaped foam products are not available because it is difficult to form the foam sheets into the molded product which are needed. Therefore, it is desirable to develop a further-improved electro-conductive thermoplastic foam.

Attempts have been made to produce electro-conductive thermoplastic foams using thermoplastic polyolefin resin, such as polyethylene, etc., but good marketable foams have not been developed because such foams as have been produced have faults such as production difficulties, quality variation, inferiority in foam mechanical properties, or difficulty to form needed foam sheets.

An object of the present invention is to provide an polyolefin-type electro-conductive thermoplastic foam which has, excellent intrinsic properties such as shock absorption, thermoformability, electro-conductivity, and quality stability, and which is easy to manufacture, and a process for preparing it.

Another object of the present invention is to provide an electro-conductive thermoplastic foam having a smooth surface without surface roughness, and a process for producing it.

A further object of the present invention is to provide a material for containers which makes it possible to prevent semiconductor integrated circuits, etc., from being damaged by static electricity, and to ensure their safe transportation, and a process for its preparation.

DISCLOSURE OF THE INVENTION

The present invention relates to a cross-linked electro-conductive thermoplastic foam which consists of 10 to 90 parts by weight of crystalline thermoplastic polyolefin resin, 10 to 90 parts by weight of low crystalline thermoplastic resin, and 5 to 40 parts by weight of electro-conductive carbon black per 100 parts by weight of a total of the aforesaid resin components, and a process for producing an electro-conductive thermoplastic foam, which comprises crosslinking and foaming a mixture consisting of 10 to 90 parts by weight of crystalline thermoplastic polyolefin resin, 10 to 90 parts by weight of low crystalline thermoplastic resin, and 5 to 40 parts by weight of carbon black per 100 parts by weight of a total of the aforesaid resin components.

MOST PREFERRED FORM FOR EMBODIMENT OF THE INVENTION

The crystalline thermoplastic polyolefin resin in the present invention is a crystalline olefin polymer of α-olefin having 2 to 8 carbon atoms as the necessary monomer. Specific examples of said crystalline polyolefin are polyethylene, polypropylene, polybutene, polymethylbutene, polymethyl-pentene, and copolymers of two members thereof, and pre-ferably polyethylene, polypropylene, and propylene ethylene random copolymer containing 2 to 5 wt % of ethylene. The melt index (MI) of the thermoplastic poly-olefin resin is preferably from 1 to 100 g/10 min, more preferably from 10 to 80 g/10 min, and most preferably from 30 to 70 g/10 min. The intrinsic viscosity ($\eta$) of the thermoplastic polyolefin resin is preferably from 1.0 to 3.0.

If the MI is smaller than 1, the surface property will be unsatisfactory, and if larger than 100, insufficient toughness will result with a risk that the formability will tend to deteriorate. The crystalline thermostatic polyolefin resin used may be satisfactorily selected on the basis of the quality and productivity of foam, and such a resin as having a good flowability and toughness is preferred. This is because the flowability of polymer composition becomes quite a bit worse when a large amount of carbon black is added and also because the resulting foam becomes very brittle when a low molecular weight resin with a good flowability is used.

As the low crystalline thermoplastic resin of the present invention, a copolymer having a crystability lower than that of low density polyethylene (density: 0.920 to 0.940; melt index: 1.0 to 5.0) is used, and a modified thermoplastic polyolefin resin or a rubber-like elastic thermoplastic resin is especially preferred.

The modified thermoplastic polyolefin resin is preferably a copolymer containing not less than 50 wt % of ethylene.

Specific examples thereof are ethylene-vinyl acetate copolymer (with a vinyl acetate content of 6 to 35 wt %, preferably 15 to 30 wt %, but not limited to these range), ethylene-ethylacrylate compolymer (with an ethylacrylate content of 5 to 20 wt %, preferably 7 to 15 wt %, without limitation), ethylene-α-olefin copolymer (with an α-olefin of 3 to 8 carbon atoms content of 5 to 30 wt %, preferably 5 to 20 wt %, without limitation), and further other modified polyolefin resin includes chlorinated polyethylene (with a chlorine content of 25 to 45 wt % preferred, without limitation). Examples of the rubber-like thermoplastic resin are thermoplastic polybutadiene resin (syndiotactic 1,2-polybutadiene preferably containing not less than 90% of 1, 2 bond) and thermoplastic styrene-butadiene resin (with a preferable styrene content of 10 to 50 wt %).

Addition of a low crystalline thermoplastic resin compensates for lowered toughness caused by additon of carbon black and enhances the foam surface smoothness by preventing outgassing from the foaming resin at the foaming process, as well as improving the foam formability. When no low crystalline thermoplastic resin is added, the foam surface becomes too rough to be marketed, and deep draw forming (depth ratio of thermoforming ≧ 0.30) such as vacuum forming is impossible on the occasion of forming.

The electro-conductive carbon used includes carbon black, carbon fiber, and graphite, any of which may be used alone or in combination with two kinds or more. In these carbon blacks, an electro-conductive furnace black and a acetylene carbon black which are superior in electro-conductivity are prefarable.

The use of a carbon black containing not more than 5% of volatile matter, preferably not more than 3%, is preferable because of causing less surface roughness and less reduction of the electro-conductivity of the foam.

In achieving a good electro-conductivity, a carbon black having a large specific surface area is preferred, which has a particle size of not larger than 100 mμ, preferably not larger than 60 mμ, and has an oil absorption (adsorbable content of dibutyl phthalate) of not less than 60 ml/100 g, preferably not less than 100 ml/100 g.

A composition ratio of the necessary components as mentioned above is composed of 10 to 90 parts by weight, preferably 20 to 80 parts by weight, and further preferably 60 to 30 parts by weight, of crystalline thermoplastic polyolefin resin, 10 to 90 parts by weight, preferably 20 to 80 parts, and further preferably 40 to 70 parts by weight, of low crystalline thermoplastic resin, and 5 to 40 parts by weight, preferably 10 to 30 parts by weight, and more preferably 15 to 25 parts by weight, of electro-conductive carbon per 100 parts of a total of the aforesaid resin components.

If the ratio of the crystalline thermoplastic polyolefin resin is too great, and the ratio of the low crystalline thermoplastic resin component too small, outgassing from the foaming resin at the foaming process will occur, the surface of the foam will become rough, and the toughness of the foam will become poor. If the ratio of the low crystalline thermoplastic resin component is too great, the mechanical strength of the resulting foam will be reduced. However, if the ratio of the electro-conductive carbon is too great, the surface property of the foam will deferiorate with reduction in the toughness; if the ratio of the electro-conductive carbon is too small, sufficient conductivity will not be obtained.

Other than the basic components mentioned above, there are certain agents which can be kneeded or mixed with said components may be added as necessary. These include different types of polymer, fire retardants, antioxidants, foaming activators, heat stabilizers, pigment anti-coagulating agents, and crosslinking activators. Examples of the crosslinking activators used are conventional crosslinking activators which are used when the polyolefin foam is manufactured, such as divinyl benzene, diaryl benzene, divinyl naphthalene, ethyleneglycol dimethacrylate, etc. These activators are used usually in the range of 0.1 to 10 parts by weight per 100 parts by weight of the resin component.

The electro-conductive foam of the present invention is prepared in accordance with conventional methods of manufacturing crosslinked foams from thermoplastic polyolefin resins.

The foam of the present invention can be prepared as follows: a composition consisting of the aforesaid thermoplastic polyolefin resin, low crystalline thermoplastic resin and electro-conductive carbon, in which a conventional foaming agent has been uniformly mixed and dispersed, is extruded at a typical cylinder temperature of 80° to 180° C. and fabricated into a sheet; the sheet is subjected to electron-beam irradiation at 1 to 25 Mrad, preferably at 5 to 20 Mrad to be crosslinked; the product thus obtained is heated at a blowing temperature of 180° C. to 240° C. to be foamed. The foam of the present invention can also be prepared by the following procedures: the composition is heated to be crosslinked and foamed under normal pressures by using conventional crosslinking agents which are lower in decomposition temperature than a forming agent used; or the composition is crosslinked and foamed by heating it under the pressure of 150 kg/cm$^2$.

The foaming agents include, but not limited to azodicarbonamide, hydrazo dicarbonamide, barium salt of azo dicarboxylic acid, dinitrosopentamethylene tetramine, nitroguanidine, p, p'-oxybisbenzene-sulfonilsemicarbazide, etc., any of which may be used alone or in the form of a mixture. Azodicarbonamide is most preferable.

The amount of a foaming agent used may be adequately selected depending on the purpose, and usually ranges approximately from 1 to 40 parts by weight, preferably from 5 to 30 parts by weight, per 100 parts by weight of the resin component. The chemical crosslinking agent includes various types of agents which are commonly used for manufacturing foams, typical of which are, for example, benzoyl peroxide, lauryl peroxide, azobis isobutylonitril, dicumyl peroxide, di-terbutylperoxide, etc. These chemicial crosslinking agents are usually used in the proportion of 0.1 to 10 parts by weight, preferably 0.5 to 5 parts by weight, per 100 parts by weight of the resin component.

As the method for crosslinking, an electron-beam crosslinking method is preferred since the most suitable crosslinking condition is obtained, the resulting foam has good formability, and a soft foam with good balanced other physical properties can easily be obtained. In the case of chemical crosslinking, since crosslinking and foaming be taken place simultaneously, making it difficult to select a suitable reaction rate of crosslinking vs. foaming. As a result, a foam containing uniform cells having a density of 0.20 to 0.025/cm$^3$, a gel fraction of 10 to 60%, and an average cell size of 0.10 to 1.0 mm is preferred for its shock absorption, strength, heat resistance, formability, surface quality, etc.

In the present invention, a foam having a thermoforming depth ratio of 0.30 to 0.80 can be obtained; the foam easily undergoes thermoforming such as by vacuum forming. If the thermo-forming depth ratio is smaller than 0.30, the thermoforming such as vacuum forming becomes impractical.

Possible Applications for Industry

The electro-conductive foam of the present invention, which is usually of sheet form, can easily be formed by vacuum forming techniques and has excellent in shock absorption properties and mechanical properties, and also electro-conductivity as a matter of course since the foam has a uniform cell size and a net work structure by crosslinking. Since the foam also has excellent surface properties in addition to the aforementioned characteristics, the foam obtained from the present invention has a high market value. Consequently, the electro-conductive thermoplastic foam of the present invention can be used in diversified areas such as: holders for inserting integrated circuit leads; bags, trays, cups, containers, etc., for transporting and storing IC-used printed circuit boards or condensers; stuffing material for cases to pack IC built-in transistors watches, cameras, etc., bags and cases for packing magnetic tapes and photographic films, for the dust-proof purpose;

chair covers, desk mats and floor mats, with the human body as parts for grounding; and other antistatic materials.

The present invention is illustrated by the below examples, in which effects are evaluated on the basis of the following standards.

(A) Foam conditions
 o Foam having uniform cell size
 Defects of surface spot; not more than 5 spots/m²
 Number of large cells on sliced inner surface: not more than 10 cells/m²
 (Note) The large cell means an unusually large cell, more than 5 times as large as surrounding fine cells, and the cell is observed as a large recession on slice surface.
 Δ Foam having rather non-uniform cell sizes
 Defects of surface spot: 6 to 20 spots/m²
 Number of large cells on sliced surface: 11 to 20 cells/m²
 x Foam having large and rough cell sizes
 Defects of surface spot: not less than 21 spots/m²
 Number of large cells over a sliced surface; not less than 21 cells/m²
(B) Volume resistivity Society of Rubber Industry, Japan, Standard (SRIS 2301)
(C) Thermoforming depth ratio The thermoforming depth ratio is represented by a ratio of depth of cup-/inside diameter at the forming limit, when cups are formed in vacuum under the condition having an inside diameter of 5 cm and different depths.

EXAMPLE 1

A mixture of 0 to 100 parts by weight of low density polyethylene (density: 0.916 g/cm³; melt index: 50 g/10 mm), 0 to 100 parts of ethylene-1-butene copolymer (density: 0.880 g/cm³; melt index: 4.0 g/10 mm), 15 to 50 parts by weight of electro-conductive furnace black (particle diameter: 46 mμ; specific surface area: 270 m²/g; oil absorption: 160 ml/g; volatile matter: 1%) and 14 parts by weight of azo dicarbonamide as the foaming agent, was uniformly dispersed. The dispersion was extruded using an extruder at 140° C. to fabricate a sheet. The sheet was crosslinked by subjecting it to electron-beam irradiation at 12 Mrad and heat-foamed at 215° C. The foam thus obtained which satisfied the requirements of the present invention had a uniform cell size without containing large and rough cell sizes, a volume resistivity of $10^5$ to $10^3$ Ω.cm which was a satisfactory value, and a good vacuum formability. The foam was especially excellent in uniformity of cell size and was one having high market value.

The results are shown in Table 1.

EXAMPLE 2

A mixture of 20 to 70 parts by weight of low density polyethylene (density: 0.916 g/cm³; melt index: 50 g/10 mm), 30 to 80 parts by weight of ethylene-1-butene copolymer (density: 0.880 g/cm³; melt index: 4.0 g/10 mm), 15 to 20 parts by weight of electro-conductive furnace black which is the same one used in Example 1, 14 parts by weight of azo dicarbonamide as the foaming agent, and 1.5 parts by weight of dicumyl peroxide as the crosslinking agent, was uniformly dispersed. The dispersion was extruded using an extruder to fabricate a sheet. The sheet was subjected to crosslinking and thermofoaming at 220° C. under normal pressures. The foam thus obtained had no large-sized rough cells, and had a satisfactory volume resistivity of $10^3$ to $10^5$ Ω.cm and a good vacuum formability as well. The results are shown in Table 2.

EXAMPLE 3

A mixture of 20 to 70 parts by weight of low density polyethylene (density: 0.916 g/cm³; melt index: 50 g/10 mm), 30 to 80 parts by weight of ethylene-1-butene copolymer (density: 0.880 g/cm³; melt index: 4.0 g/10 mm), 15 to 20 parts by weight of electro-conductive furnace black (particle diameter: 30 mμ; specific surface area: 220 m²/g; oil absorption: 200 ml/100 g; volatile matter: 2%), 14 parts by weight of azo dicarbonamide as the foaming agent, 6 parts by weight of zinc stearate as the foaming activator, and 1.5 parts by weight of dicumyl peroxide as the chemical crosslinking agent, was uniformly dispersed. The dispersion was subjected to pressure crosslinking and thermofoaming using a metal mold of 250×250×7 mm at a temperature of 170° C. and a pressure of 150 kg/cm². G. The foam thus obtained was approximately uniform in cell size with no large and rough cells observed, and had as satisfactory a volume resistivity as $10^3$ to $10^5$ Ω.cm. The results are shown in Table 3.

TABLE 1

| | Parts by weight | | | | | | | | |
|---|---|---|---|---|---|---|---|---|---|
| Low density polyethylene | 0 | 20 | 50 | 50 | 50 | 50 | 80 | 90 | 100 |
| Ethylene-1-butene copolymer | 100 | 80 | 50 | 50 | 50 | 50 | 20 | 10 | 0 |
| Electro-conductive furnace black | 20 | 20 | 15 | 20 | 30 | 50 | 20 | 20 | 20 |
| Azo dicarbonamide | 14 | 14 | 14 | 14 | 14 | 14 | 14 | 14 | 14 |
| Foam conditions | Δ | o | o | o | o | x | o | Δ | x |
| Volume resistivity (Ω · cm) | $3.5 \times 10^4$ | $3.3 \times 10^4$ | $7.5 \times 10^5$ | $3.5 \times 10^4$ | $6.3 \times 10^3$ | $3.2 \times 10^2$ | $3.3 \times 10^4$ | $3.5 \times 10^4$ | $3.2 \times 10^4$ |
| Depth ratio of thermoforming (H/D) | 0.42 | 0.40 | 0.42 | 0.40 | 0.38 | 0.20 or less | 0.40 | 0.20 or less | 0.20 or less |

TABLE 2

| | Parts by weight | | | |
|---|---|---|---|---|
| Low density polyethylene | 20 | 50 | 50 | 70 |
| Ethylene-1-butene | 80 | 50 | 50 | 30 |

TABLE 2-continued

| | Parts by weight | | | |
|---|---|---|---|---|
| copolymer | | | | |
| Electro-conductive furnace black | 20 | 15 | 20 | 20 |
| Dicumyl peroxide | 5 | 5 | 5 | 5 |
| Azo dicarbonamide | 14 | 14 | 14 | 14 |
| Foam conditions | o | o | o | o |
| Volume resistivity ($\Omega \cdot cm$) | $3.3 \times 10^4$ | $8.0 \times 10^5$ | $3.5 \times 10^4$ | $3.2 \times 10^4$ |
| Depth ratio of thermoforming (H/D) | 0.40 | 0.42 | 0.36 | 0.40 |

TABLE 3

| | Parts by weight | | | |
|---|---|---|---|---|
| Low density polyethylene | 20 | 50 | 50 | 70 |
| Ethylene-1-butene copolymer | 80 | 50 | 50 | 30 |
| Electro-conductive furnace black | 20 | 15 | 20 | 20 |
| Dicumyl peroxide | 1.5 | 1.5 | 1.5 | 1.5 |
| Zinc stearate | 6 | 6 | 6 | 6 |
| Azo dicarbonamide | 14 | 14 | 14 | 14 |
| Foam conditions | o | o | o | o |
| Volume resistivity ($\Omega \cdot cm$) | $3.2 \times 10^4$ | $7.8 \times 10^5$ | $3.4 \times 10^4$ | $3.0 \times 10^4$ |
| Depth ratio of thermoforming (H/D) | 0.36 | 0.40 | 0.34 | 0.38 |

We claim:

1. A crosslinked electro-conductive thermoplastic foam consisting of
   10 to 90 parts by weight of a crystalline thermoplastic polyolefin resin selected from the group of polyethylene, polypropylene and polypropylene ethylene copolymer,
   10 to 90 parts by weight of a low crystalline thermoplastic resin selected from ethylene-vinyl acetate copolymer with the ethylene content of not less than 50 wt % and ethylene-α-olefin of 3 to 8 carbon atoms copolymer with the ethylene content of not less than 50 wt %, and
   5 to 40 parts by weight of electro-conductive carbon per 100 parts by weight of a total of the aforesaid resin components.

2. An electro-conductive thermoplastic foam claimed in claim 1, wherein the density of the foam is from 0.20 to 0.025 g/m³, the gel fraction is from 10 to 60%, and the average cell size is from 0.10 to 1.0 mm.

3. An electro-conductive thermoplastic foam claimed in claim 1, wherein the amount of the crystalline thermoplastic polyolefin resin is 80 to 20 parts by weight, the amount of the low crystalline thermoplastic resin is 20 to 80 parts by weight, and the amount of the electro-conductive carbon is 10 to 30 parts by weight per 100 parts by weight of the aforesaid resin components.

4. An electro-conductive thermoplastic foam claimed in claim 1, wherein the crystalline thermoplastic olefin resin is crystalline thermoplastic polyolefin resin having the melt index of 1 to 100 g/10 min.

5. An electro-conductive thermoplastic foam claimed in claim 1, wherein the low crystalline thermoplastic resin is at least one thermoplastic resin selected from the group of ethylene-vinyl acetate copolymer with the vinyl acetate content of 6 to 35 wt % and ethylene-α-olefin of 3 to 8 carbon atoms copolymer with the α-olefin content of 5 to 30 wt %.

6. An electro-conductive thermoplastic foam claimed in claim 1, wherein the thermoforming depth ratio of the electro-conductive thermoplastic foam is from 0.30 to 0.80.

7. A process for preparing an electro-conductive thermoplastic foam, which comprises
   (1) forming into a sheet a mixture of 10 to 90 parts by weight of a crystalline thermoplastic polyolefin resin selected from the group of polyethylene, polypropylene and propylene ethylene copolymer, 10 to 90 parts by weight of a low crystalline thermoplastic resin selected from ethylene-vinyl acetate copolymer with the ethylene content of not less than 50 wt % and ethylene-α-olefin of 3 to 8 carbon atoms copolymer with the ethylene content of not less than 50 wt %, and 5 to 40 parts by weight of an electro-conductive carbon and 1 to 40 parts by weight of a foaming agent, respectively, per 100 parts by weight of a total of the aforesaid resin components, and
   (2) crosslinking the sheet by irradiation with electron beams, and then
   (3) foaming the crosslinked sheet by heating.

8. A process for preparing an electro-conductive thermoplastic foam, which comprises crosslinking and foaming by heating a mixture of 10 to 90 parts by weight of a crystalline thermoplastic polyolefin resin selected from the group of polyethylene, polypropylene and propylene ethylene copolymer, 10 to 90 parts by weight of a low crystalline thermoplastic resin selected from ethylene-vinyl acetate copolymer with the ethylene content of not less than 50 wt % and ethylene-α-olefin of 3 to 8 carbon atoms copolymer with the ethylene content of not less than 50 wt %, and 5 to 40 parts by weight of an electro-conductive carbon, 1 to 40 parts by weight of foaming agent and 0.1 to 10 parts by weight of a chemical crosslinking agent having a decomposition temperature lower than that of said foaming agent respectively per 100 parts by weight of a total of the aforesaid resin components.

* * * * *